United States Patent [19]
Timlin et al.

[11] Patent Number: 5,304,500
[45] Date of Patent: Apr. 19, 1994

[54] METHOD OF MAKING ELECTRO-OPTICAL DETECTOR ARRAY

[75] Inventors: Harold A. Timlin, Mason; Charles J. Martin, West Chester, both of Ohio

[73] Assignee: Cincinnati Electronics Corporation, Mason, Ohio

[21] Appl. No.: 89,461

[22] Filed: Jul. 12, 1993

Related U.S. Application Data

[62] Division of Ser. No. 609,678, Nov. 6, 1990, Pat. No. 5,227,656.

[51] Int. Cl.$^5$ .......................................... H01L 31/18
[52] U.S. Cl. .......................................... 437/5; 437/2; 437/4; 257/443; 257/459; 257/460; 136/259
[58] Field of Search ............... 257/441, 443, 459, 460; 437/2–5; 136/259

[56] References Cited

U.S. PATENT DOCUMENTS

| | | | |
|---|---|---|---|
| 3,483,096 | 12/1969 | Gri et al. | 204/15 |
| 3,555,818 | 1/1971 | Lambert et al. | 148/186 |
| 3,577,175 | 5/1971 | Gri et al. | 317/237 |
| 3,808,435 | 4/1974 | Bate et al. | 250/332 |
| 4,053,919 | 10/1977 | Andrews II et al. | 357/308 |
| 4,364,077 | 12/1982 | Chiang | 357/30 P |
| 4,625,389 | 12/1986 | Readhead | 29/572 |
| 4,646,120 | 2/1987 | Hackskaylo et al. | 357/32 X |
| 4,696,094 | 9/1987 | Yves et al. | 437/23 |
| 4,783,594 | 11/1988 | Schulte et al. | 259/370.08 |
| 4,956,687 | 9/1990 | deBruin et al. | 357/30 H |
| 4,972,244 | 11/1990 | Buffet et al. | |
| 4,975,567 | 12/1990 | Bishop et al. | 357/4 |
| 5,116,427 | 5/1992 | Fan et al. | 136/259 |

FOREIGN PATENT DOCUMENTS

| | | |
|---|---|---|
| 0116791 | 8/1984 | European Pat. Off. |
| 0350351 | 1/1990 | European Pat. Off. |
| 57-73984 | 5/1982 | Japan |
| 58-164261 | 9/1983 | Japan |
| WO87/07083 | 11/1987 | PCT Int'l Appl. |

Primary Examiner—George Foursom
Assistant Examiner—David Mason
Attorney, Agent, or Firm—Lowe, Price, LeBlanc & Becker

[57] ABSTRACT

Each diode of an indium antimonide electro-optical detector array on a dielectric backing transparent to optical energy to be detected includes a junction that less than about a half micron from the diode surface on which the energy is initially incident. The optical energy is incident on a P-type doped region prior to being incident on a bulk N-type doped region. Both P-and N-type doped regions of adjacent diodes are spaced from each other. Metal electrically connects the P-type doped regions together without interfering substantially with the incident optical energy. A multiplexer integrated circuit substrate extends parallel to the backing and includes an array of elements for selective readout of the electric property of the diodes. The elements and diodes have approximately the same topographical arrangement so that corresponding ones of the elements and diodes are aligned. An array of indium columns or bumps connects the corresponding aligned elements and diodes.

10 Claims, 3 Drawing Sheets

METHOD OF MAKING ELECTRO-OPTICAL DETECTOR ARRAY

This application is a divisional of application Ser. No. 07/609,678 filed Nov. 6, 1990 now U.S. Pat. No. 5,227,656.

FIELD OF INVENTION

The present invention relates generally to electro-optical detector arrays and more particularly to a method of making an electro-optical detector array having front faces of semiconductor elements illuminated by the optical energy.

BACKGROUND ART

Semiconductor electro-optical detectors are either of the photovoltaic or photoresistive type. Different types of electro-optical detectors are employed for different wavelength regions from infrared through ultraviolet. For example, photovoltaic electro-optical detectors for the infrared wavelength range from approximately 8 to 12 microns and 1 to 5.6 microns are frequently made of mercury cadmium telluride (HgCdTe) and indium antimonide (InSb), respectively. The specific construction of indium antimonide electro-optical detectors is described, for example, in commonly assigned U.S. Pat. Nos. 3,483,096, 3,554,818 and 3,577,175. While the following description is made for InSb electro-optical detectors, the invention in many of its broadest aspects is not limited to this material.

Single element devices, as disclosed in the aforementioned patents, typically include a P-N junction wherein an N-doped bulk substrate carries a P-doped region that is exposed to an optical energy source being detected. Usually, the P-N junction is no greater than about 4 microns from the surface of a P-type region on which the optical energy to be detected is incident. In other words, the P-type region exposed to the optical radiation to be detected has a thickness of no greater than about 4 microns. For certain InSb devices, the P-N junction is closer than 0.5 microns to the surface of the P-type region exposed to the radiation. The P-type region is desirably positioned so that the optical radiation is directly incident thereon to enable photogenerated charge carriers formed in the P-type region to diffuse, somewhat uninterrupted, to the junction. Even in this configuration, a significant amount of optical energy penetrates through the P-type region into the P-N junction where some additional charge carriers are generated and on into the N-type region where still more charge carriers are generated. As long as this absorption in the n-type material does not occur too far away from the junction, the resulting charge carriers also diffuse back to the junction. In addition, this arrangement enables optical energy that is not absorbed in the P-type region to reach the P-N junction directly. Thereby, efficiency in converting optical energy to electric energy is relatively high if the P-doped region of an indium antimonide detector is arranged such that the optical energy is incident on the P-type region.

While these characteristics have long been known, to our knowledge, they have not been achieved when relatively large InSb electro-optical semiconductor detector arrays have been manufactured. In the large InSb array prior art of which we are aware, it has been the practice to illuminate the relatively thick N-type doped bulk substrate semiconductor material, i.e., the "back" face of the array has been illuminated. The thickness of the illuminated N-type doped bulk substrate is typically 10 microns which increases the probability that photogenerated charge carriers will interact with crystal defects or other charge carriers in the N-type bulk substrate. This is particularly true of the shortest wavelength energy to which the optical detector is exposed because the shortest wavelength energy is absorbed closest to the back face, and the resulting photogenerated charge carriers must travel the greatest distance to the P-N junction. In addition, very little, if any, of the optical energy in the 1-4 micron region can propagate unimpeded to the P-N junction through the bulk material.

The construction and manufacturing method of a typical prior art indium antimonide, photovoltaic detector array are illustrated in FIGS. 1 and 2. In this and other prior art arrangements, the optical energy to be detected is first incident on the relatively thick (about 10-20 microns) N-type bulk substrate. Hence, the distance between the P-N junction and the surface on which the optical radiation to be detected is first incident is approximately 10-20 microns. For the shortest wavelengths in the 1-5.6 micron band to be detected, i.e., between 1 and 3 microns, there is a relatively low quantum efficiency because photogenerated charge carriers created in the N-type bulk substrate in response to the incident optical energy do not proceed in an unimpeded manner to the N-type bulk substrate. Instead, the free charge carriers resulting from absorption of optical energy photons frequently interact with the InSb crystal lattice and crystal defects prior to reaching the P-N junction, causing the carriers to lose energy and recombine with other carriers of the opposite type and therefore go undetected. In addition, very little of the shortest wavelength energy is able to reach the junction without being absorbed in the N-type material and create photogenerated carriers therein.

In the prior art arrangement illustrated in FIGS. 1 and 2, an indium antimonide N-type bulk substrate 23, having a thickness of approximately 15 mils with an array of P-type regions 24 formed thereon, is connected to multiplexer substrate 25 by indium columns 26, which can be grown on metal contact pads (not shown), typically of gold, nickel or chromium for the P-type regions or on the multiplexer substrate or on a combination of both. A P-N junction, forming a diode, exists at each location of P-type region 24 on N-type bulk substrate 23. After the detector assembly including N-type bulk substrate 23 and an array of P-type regions 24, formed by gaseous diffusion or ionic bombardment, has been connected to multiplexer substrate 25, the bulk material substrate is mechanically and/or chemically thinned and polished to a thickness of approximately 10 microns, as illustrated in FIG. 2. Multiplexer substrate 25 includes electronic circuitry having switching elements with substantially the same topography as the topography of P-type regions 24. The electronic circuitry in multiplexer substrate 25 selectively reads out the signal from a selected diode of the electro-optical detector array through the indium bump to one or a few common signal leads on the multiplexer chip. This causes readout of the optical energy incident on a surface of N-type bulk substrate 23 corresponding generally with the P-type region 24 connected to the indium column or bump 26 which is selected by the circuitry on multiplexer N-type bulk substrate 25.

To withstand the mechanical forces during and after thinning, an epoxy bonding agent is injected between the array including N-type bulk substrate 23 and P-type regions 24 and multiplexer 25. The bonding agent fills the space between indium columns or bumps 26.

In use, the structure of FIG. 2 is arranged so that the optical energy is initially incident on N-type bulk substrate 23. The optical energy creates free charge carriers, an electron-hole pair for each photon absorbed, in bulk substrate 23. If the minority carrier, i.e., the hole in N-type indium antimonide N-type bulk substrate 23, recombines with a majority carrier, no current results and the optical energy is not detected. If, however, the minority carrier diffuses to and crosses the junction between N-type bulk substrate 23 and a particular P-type region 24, current is produced in the P-type region.

Whether a minority carrier diffuses across the junction is a function of (1) how far away from the junction the electron-hole pair is at the time it is created by the incident optical energy, (2) the diffusion length in bulk material 23, and (3) the density of the bulk material defects which act as recombination centers. These defects can exist before processing is performed. However, other defects are created by several of the many processing steps, e.g., by ion implantation, thinning and/or bump bonding. In general, detector efficiency in converting optical energy to electrical energy decreases as the distance between the junction and the surface on which the optical energy is initially incident increases.

Thinning and polishing operations performed on N-type bulk substrate 23 place severe stresses on the detector and often result in N-type bulk substrate cracking. Polishing compounds and mechanical abrasion used to thin N-type bulk substrate 23 result in microcrystalline damage on the surface of and into bulk material 23 on which the optical energy is initially incident. The microcrystalline damage has severe detrimental effects on the electrical characteristics of the array. The resulting degradation of the bulk material in N-type bulk substrate 23 on which the optical energy is incident produces a high surface recombination rate in the N-type bulk substrate, lowering quantum efficiency dramatically, particularly at the shortest wavelengths which are absorbed close to the surface of N-type bulk substrate 23.

The detector arrays are usually operated at cryogenic temperatures, in the liquid helium or liquid nitrogen range. While lower quantum efficiencies at short wavelengths may not occur in InSb arrays at liquid nitrogen temperatures, the diffusion length (mentioned above) decreases dramatically as temperature is lowered further such that at liquid helium temperature ranges (of interest to astronomers), the performance of the prior art devices is degraded. Also, operation at liquid nitrogen temperatures causes the arrays to undergo severe mechanical strain due to thermal expansion mismatch between the bulk material of N-type bulk substrate 23 and multiplexer substrate 25. The very thin bulk material of N-type bulk substrate 23 cannot always accommodate the induced strain and is subject to breakage or may become deformed to cause bonds between indium columns 26 and N-type bulk substrate 23 or the pads thereon to fail.

An additional disadvantage of the prior art methods is that the thinning process is performed after sawing the detector wafer into individual chips and after bump bonding occurs. Hence, e.g., if there are ten arrays on a wafer, the thinning process is performed ten different times, resulting in an expensive processing technique.

It is, accordingly, an object of the present invention to provide a new and improved method of making electro-optical detector arrays and to a method of making the same.

Another object of the invention is to provide a new and improved method of making electro-optical detector arrays having P-N junctions in very close proximity to a surface on which optical energy is initially incident.

An added object of the invention is to provide a new and improved method of making electro-optical detector for infrared energy over a relatively wide wavelength band, which detector has relatively high quantum efficiency for wavelengths throughout the wide band.

A further object of the invention is to provide a new and improved method of making electro-optical detectors adapted to be used in cryogenic temperature environments, but which has stable mechanical and electrical properties even though the array is subject to temperature cycle extremes.

Still another object of the invention is to provide a new and improved method of making electro-optical detector arrays wherein all detector processing is performed prior to connecting the wafer to external control circuitry, e.g., a multiplexer N-type bulk substrate.

An additional object of the invention is to provide a new and improved method of making indium antimonide detector arrays having relatively high quantum efficiency over the entire spectrum of use for such arrays, wherein the array has stable mechanical and electrical properties, even though it is operated at cryogenic temperatures and is subject to cycling between those temperatures.

Still another object of the present invention is to provide a new and improved method of making indium antimonide detector arrays wherein P-type material in the indium antimonide is positioned so that infrared optical energy to be detected is initially incident on the P-type material, instead of on the N-type material of the detector.

THE INVENTION

In accordance with one aspect of the present invention an electro-optical detector comprises a non-metallic mechanical support backing transparent to optical energy to be detected, in combination with an array of semiconductor diodes on the backing, which diodes have an electrical property affected by optical energy incident thereon and include a junction separating first and second differently doped regions, wherein the first and second regions are positioned on the backing and are arranged so that the optical energy to be detected and propagating through the backing is incident on the first region prior to being incident on the second region. The first regions are made of a material and have a thickness that is a function of the lifetime of carriers produced in the first regions in response to photons of the optical energy and the capture cross section of the optical energy photons by the lattice such that the carriers reach the junction without interacting with other possible carriers in the first regions or the photons traverse the first regions without being absorbed; for InSb, this thickness is less than one-half micron.

In accordance with another aspect of the invention an electro-optical detector comprises a dielectric backing transparent to optical energy to be detected, in combination with an array of indium antimonide semiconductor diodes on the backing, which diodes include a junction separating P-type and N-type doped regions that are positioned on the backing and arranged so that the optical energy to be detected and propagated through the backing is incident on the P-type doped region prior to being incident on the N-type doped region.

In accordance with an additional aspect of the invention, an electro-optical detector comprises a dielectric backing transparent to optical energy to be detected in combination with an array of semiconductor diodes on the backing, which diodes have an electrical property affected by optical energy incident thereon and include a junction separating the first and second differently doped regions, wherein the first and second regions are positioned on the backing and arranged so that the optical energy to be detected and propagating through the backing is incident on the first region prior to being incident on the second region. Both regions of adjacent ones of the diodes are spaced from each other, to basically form islands in the backing. The second regions are thinned bulk semiconductor material while the first regions are layers of the semiconductor material formed on the thinned bulk semiconductor material.

In accordance with a further aspect of the invention an electro-optical detector comprises a non-metallic mechanical support backing transparent to optical energy to be detected in combination with an array of semiconductor diodes on the backing, which diodes have an electrical property affected by optical energy incident thereon and include a junction separating first and second differently doped regions, wherein the first regions are positioned on the backing and are arranged so that the optical energy to be detected and propagating through the backing is incident on the first region prior to being incident on the second region. The second regions are formed of bulk material, while the first regions are layers formed by diffusing a dopant into the bulk material, or by implanting ions into the bulk material.

In a preferred embodiment, metal on the non-metallic mechanical support backing electrically connects the first regions together without interfering substantially with the optical energy incident on the first region, i.e. , on the P-type region of the indium antimonide detector. In one embodiment, the metal is arranged as a grid of intersecting strips extending in mutually perpendicular directions. In a second embodiment, the metal is arranged as a film having windows for enabling the optical energy to be detected to be incident on the first regions.

A multiplexer integrated circuit substrate extends parallel to the backing and includes an array of elements for selective readout of the electric property of the diodes. The readout elements and diodes have approximately the same topography so that corresponding ones of the elements and diodes are aligned. An array of metal (preferably indium) bumps or columns connects the corresponding adjacent elements and diodes.

The above and still further objects, features and advantages of the present invention will become apparent upon consideration of the following detailed description of several specific embodiments thereof, especially when taken in conjunction with the accompanying drawings.

DESCRIPTION OF THE PREFERRED EMBODIMENTS

Figure 1:
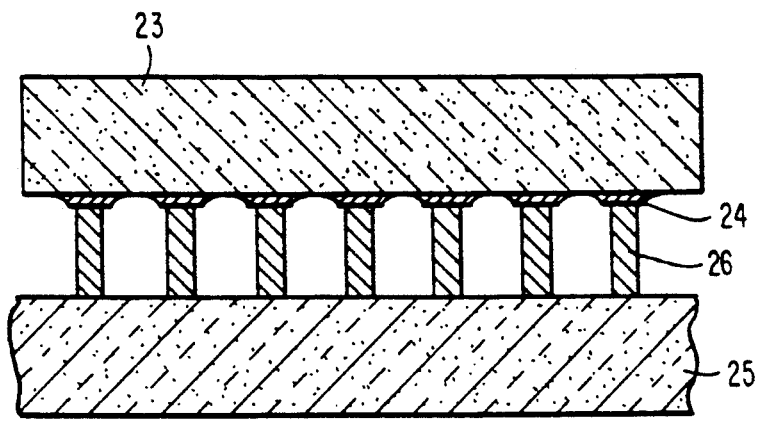
FIGS. 1 and 2, described supra, are illustrations of a prior art indium antimonide infrared detector array.
Figure 2:
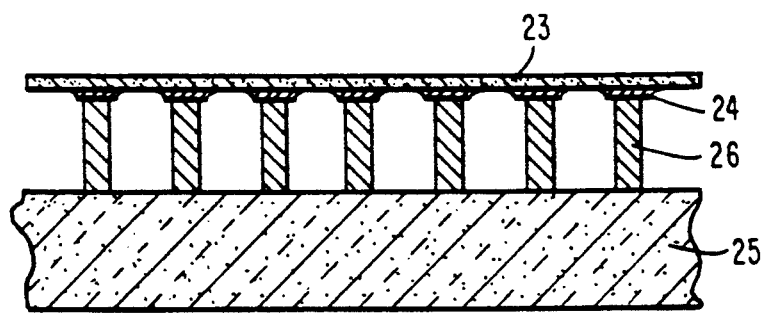
Figure 3:
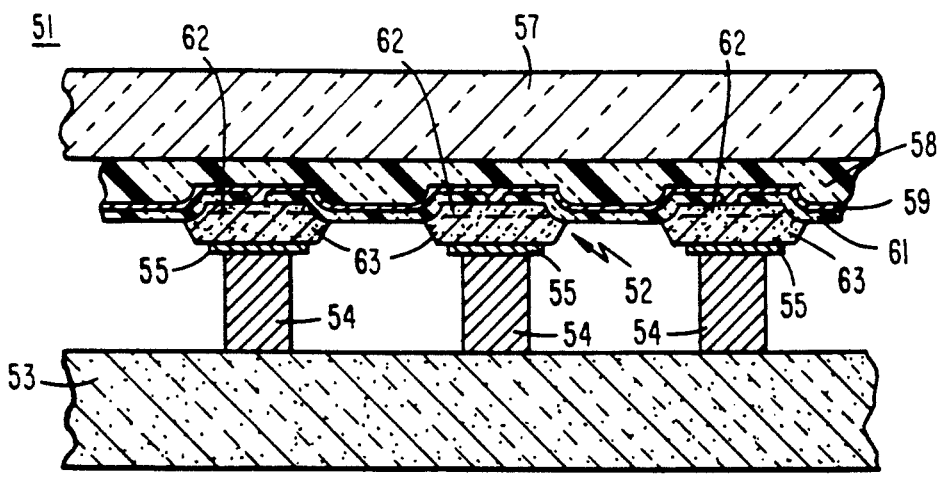
FIG. 3 is a side view of one preferred embodiment of an indium antimonide detector array in accordance with the present invention.

Reference is now made to FIG. 3 wherein photovoltaic indium antimonide infrared detector diode array 52 for radiation in the wavelength region from 1 to 5.6 microns is illustrated as being mounted on optically transparent backing 51. Multiplexer integrated circuit substrate 53, that extends parallel to backing 51, is electrically connected to the diodes of the array by indium columns 54.

The diodes of array 52 are arranged on backing 51, transparent to the optical energy to be detected, so that P-type doped regions 62 of the diodes have the optical energy to be detected incident on them prior to the energy being incident on N-type bulk substrate regions 63 of the diodes in the array. The diodes of the array are formed as islands, such that adjacent diodes are spaced from each other by dielectric. P-N junctions of the diodes of array 52 between P-type and N-type regions 62 and 63 are no more than approximately four microns (and are typically less than about a half micron) from the surface of each diode on which the optical energy to be detected is initially incident. Because of the close distance of the individual junctions to the surface on which the optical energy is initially incident, charge carriers formed in P-type regions 62 diffuse directly to the junction to cause efficient transfer of optical energy into electrical energy by the semiconductor diodes of array 52, throughout the wavelength region of interest, including the short wavelength end of the spectrum. Current flowing in the N-type regions of the diodes of array 52 as a result of the incident optical energy is transferred to elements in multiplexer 53 by way of metal contact pads 55 on N-type regions 63, and the connections of the metal pads to the multiplexer elements by way of indium columns 54.

Dielectric backing 51, transparent to the optical energy to be detected, includes dielectric plate 57 (e.g., of sapphire or gallium arsenide) which serves as a window and has a backface covered with epoxy glue layer 58, which overlays metal grid layer 59, typically formed of intersecting gold strips extending in mutually perpendicular directions. Metal grid layer 59 connects each of P-type regions 62 to a reference potential level, such as ground. The vast majority of metal grid 59 extends over oxide layer 61, preferably silicon monoxide or silicon dioxide, which overlays the vast majority of each of P-type regions 62 of the indium antimonide diodes of array 52 and is transparent to the optical energy to be detected, as is plate 57. Metal pads 55 are deposited on the faces of N-type regions 63 remote from the faces of P-type regions 62 on which the optical energy to be detected is initially incident.

Metal grid 59 extends through a portion of oxide layer 61 to establish contact with the front face of each of P-type regions 62. The percentage of the area of each front face of region 62 covered by metal grid 59 is relatively small so that the metal grid does not shadow a substantial portion of the otherwise exposed front face of P-type regions 62. The diodes of array 52 and metal grid 59 are preferably arranged in a square matrix, although this is not necessarily the case; e.g., the diodes of array 52 can be arranged in a linear array, a rectangular array or even in a circular array. Usually at least 16 diodes comprise an array of interest for the present invention.

P-type region 62, N-type region 63 and the associated junction of each indium antimonide diode of array 52 are arranged so that almost all of the 1-2 micron radiation to be detected is either absorbed in the P-type region or the junction, while some of the 2 micron and longer wavelength radiation penetrates through the P-type region and the junction to the N-type region. To this end, the distance to the electrical P-N junction between regions 62 and 63 from the face of P-type region 62 contacting oxide layer 61 is no more than 4 microns and is likely to be 0.5 micron or less, while the thickness of N-type region 63 is between 5 and 20 microns. This construction enables a significant number of photons to be absorbed in or near the junction such that charge carriers resulting from the incident optical radiation diffuse to the junction without recombining. Thereby, there is improved quantum efficiency in transferring optical energy to electrical energy, particularly in the short wavelength 1 to 2 micron region.

Oxide layer 61 engages upper and side surfaces of P-type regions 62, as well as side surfaces of N-type regions 63, to provide an electrical insulating layer for the P-N junctions. In addition, oxide layer 61 prevents etchants used to isolate the indium antimonide diodes of array 52 into islands, as described infra, from attacking metal grid layer 59.

Figure 4:
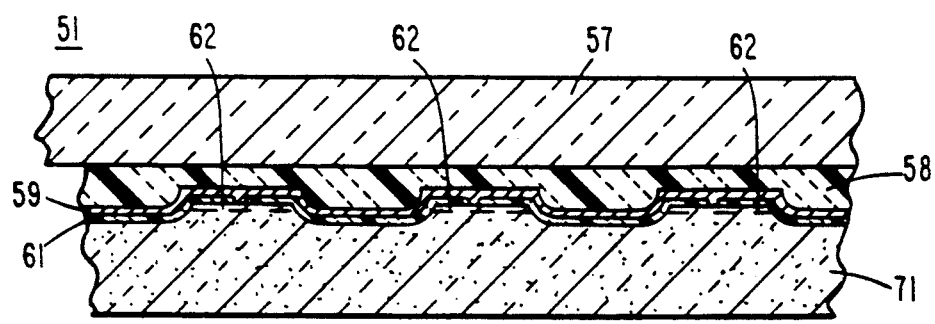
FIGS. 4-7 are illustrations of intermediate structures used to form the indium antimonide detector array of FIG. 3.
Figure 5:
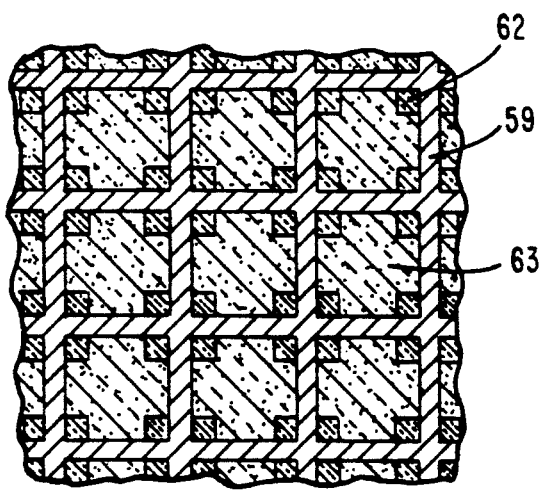

A preferred method of forming the structure illustrated in FIG. 3 is illustrated in FIGS. 4-7. Initially, as illustrated in FIG. 4, bulk N-type indium antimonide substrate 71, having a thickness of approximately 10 mils, for example, has P-type regions 62 formed thereon by using a gaseous deposition process or by ion bombardment. Oxide layer 61 and metal grid 59 are then deposited in sequence on the exposed, upper face of N-type bulk substrate 71 and P-type regions 62 to form the structure, somewhat as illustrated in FIG. 5. (FIG. 5 is a schematic representation of metal grid layer 59, as well as the top surfaces of P-type regions 62 and N-type bulk substrate 71; oxide layer 61 is not illustrated, for clarity.) Thereby, there is formed a matrix of square mutually spaced P-type regions 62 which overlay the top face of N-type bulk substrate 71, leaving a row and column matrix arrangement of the N-type bulk substrate that is not covered by the P-type regions. Metal grid 59 overlays a portion of illustrated faces of P-type region 62 and N-type bulk substrate 71.

Plate, i.e. window, 57 is bonded to the exposed surfaces of metal grid 59 and oxide layer 61 by epoxy glue layer 58 to form the structure illustrated in FIG. 4. Typically, anti-reflective coatings are provided for the indium antimonide face exposed to the optical energy, in a manner well known to those skilled in the art. For clarity purposes, the anti-reflective coatings are not illustrated.

Figure 6:
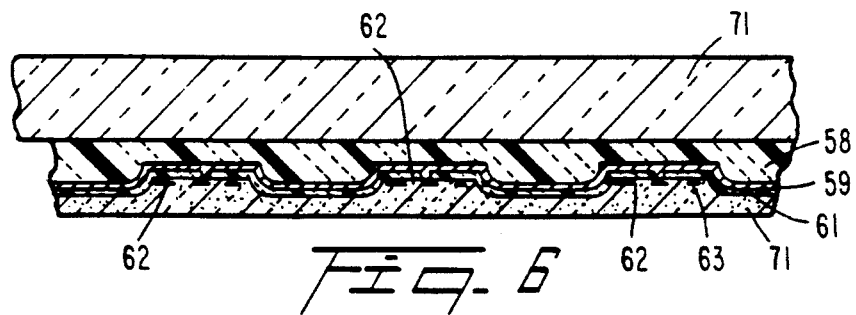
Figure 7:
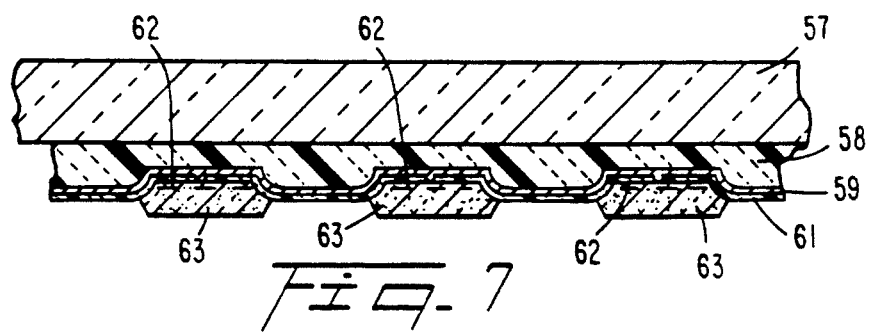

After the structure illustrated in FIG. 4 has been fabricated, the thickness of N-type bulk substrate 71 is reduced, to about 10 to 20 microns, as illustrated in FIG. 6. The thickness of N-type bulk substrate 71 is reduced, i.e., the N-type bulk substrate is thinned, by conventional mechanical and/or chemical means. An etchant mask is then formed on the exposed regions of bulk substrate layer 71 corresponding generally to the oxide layer regions that contact N-type bulk substrate 71, FIG. 6. An indium antimonide wet chemical etchant is then applied to the etchant mask and the exposed face of N-type bulk substrate 71, to cause trenches to be formed between the N-type regions 63, as illustrated in FIG. 7. Dry, i.e., plasma, etching or ion beam milling can also be used to form trenches in the detector material; the trenches isolate individual islands of the detector material to form isolated detector diodes. Thereby, multiple spaced diodes, each including P-type region 62 and N-type region 63, are formed. The N-type regions of all the diodes are mechanically and electrically spaced from each other; the P-type regions of the diodes are all mechanically spaced from each other, but are electrically connected to each other by metal grid 59.

After the structure illustrated in FIG. 7 has been manufactured, metal ohmic contact pads 55 (FIG. 3) are deposited on N-type regions 63 and columns or bumps 54 are grown on the metal pads. In particular, multiplexer substrate 53 is connected to the diodes of array 52 by growing indium columns or bumps 54 on the metal pads and/or regions of the multiplexer corresponding with and topographically aligned with the diodes of array 52. Then the wafer is sawed into individual arrays that are bump-bonded to multiplexer readouts.

In contrast to previous structures, which were P-type indium antimonide "islands" with a common N-type indium antimonide N-type bulk substrate (commonly referred to as a "P on N" structure), the structure of the present invention consists of islands each having an N-type region on a P-type region to form a separate diode having a P-N junction. In the prior art, the optically produced carriers must traverse many microns of N-type indium antimonide to reach a carrier collection region. In the InSb embodiment of the present invention, the optically produced carriers only must traverse 0.5 microns (or less) of P-type region 62 to reach the carrier collection region. In the present invention, the P-type material in the islands is electrically connected by metal grid pattern 59 and all of the diode islands are mechanically spaced from each other by etching the material between the P-type layers. Because of these factors, the present invention is considered as an "N on P" device.

The only reason, in the present invention, for thinning the N-type bulk substrate is to allow the etching step, i.e., removal of a substantial amount material between the P-type regions, to occur quickly and with minimal lateral etching. Because the device is illuminated from the "front," i.e., P-type side, mechanical damage arising from machining the N-type bulk material does not adversely affect the optical and electrical detection properties of the array. The P-type region, in many instances, extends less than 1 micron from the surface of the InSb on which the energy to be detected is incident. By arranging the carrier collection region to be so close to the surface on which the energy to be detected is incident, all of the problems of minority carriers having to diffuse "long" distances (approximately 10 microns) through N-type material with high concentrations of recombination centers are eliminated.

In the present invention, the detector material is basically processed in wafer form, thereby improving planarity and thickness control. In many cases, the manufacturing procedure also eliminates the stress from N-type bulk substrate 71 since the detector and multiplexer N-type bulk substrates can be made of the same material or of materials with the same or nearly the same thermal coefficients of expansion. Hence, there is virtually no stress to cause the bonds to indium columns 54 to fail. Further, there is complete electrical isolation of the detector diodes of array 52 because there is no electrical contact between adjacent N-type regions 63, thereby eliminating optical and electrical crosstalk between the diodes of array 52. By physically removing the indium antimonide between adjacent diodes of the array, charge carriers that might diffuse sidewise are decoupled from adjacent diodes.

Isolating the individual indium antimonide diode detector islands removes thermal expansion stresses from the detector material. Thermal stress problems in the very brittle indium antimonide detector material are relieved because of the small size of the individual islands forming detector array 52. In the prior art, thermal stress problems frequently occurred because of the differential expansion of the indium antimonide N-type bulk substrate relative to the multiplexer N-type bulk substrate. In the prior art, the bulk indium antimonide has an area comparable to the area of the multiplexer so that expansion of the indium antimonide relative to the multiplexer causes stresses to be established in the indium antimonide. Because the diodes in the present invention are formed as spatially isolated, small islands, the expansion of any diode element is negligible relative to the expansion of the multiplexer.

Hence, the structure of FIG. 3 is made by beginning with the normal process for making InSb diode arrays, starting with a bulk N-type InSb wafer. The surface of the wafer is then modified by diffusion or ion implantation to create a P-type layer. In the "mesa" method of forming diode arrays, a photomask and etch process is used to delineate individual P-type mesa regions by etching away the P-type (and some N-type) InSb between the desired P-type areas. The etching is very shallow, on the order of 1 to 4 microns, as the thickness of the P-type region is usually only about 0.4 microns. The edge of the P-N junction of each diode is exposed on the side walls of each mesa. Oxide and metal patterns are then deposited on this surface just prior to attachment to the transparent backing. Subsequent backside thinning and etching are performed in accordance with the present invention, as previously described in connection with FIGS. 3-7.

Figure 8:
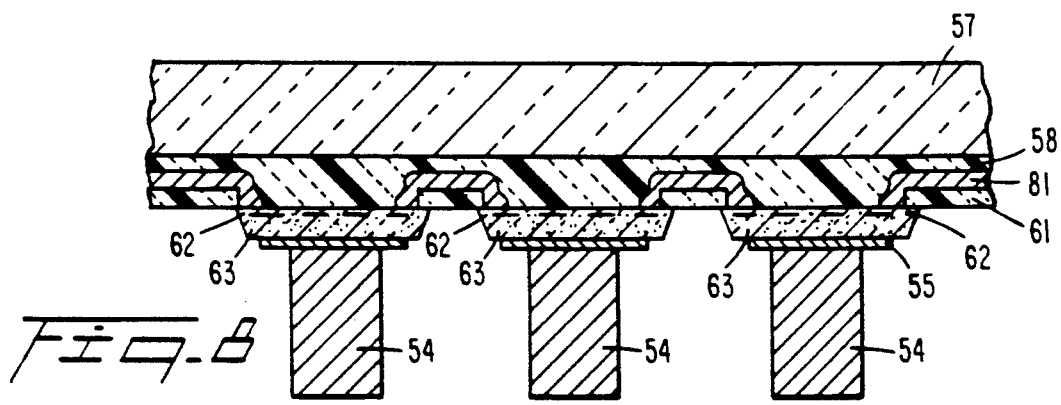
FIG. 8 is a side sectional view of a further embodiment of the present invention.
Figure 9:
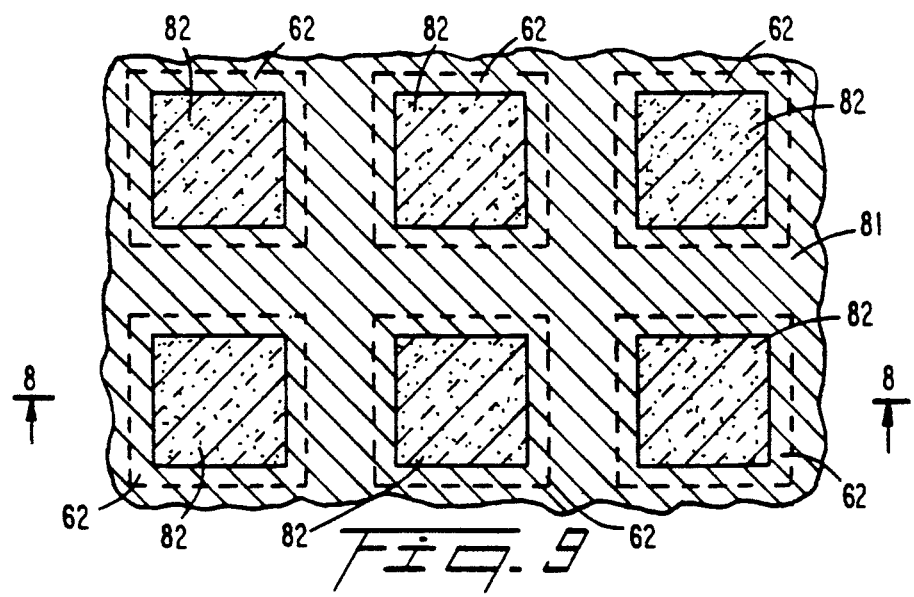
FIG. 9 is a plan sectional view through lines 9—9, FIG. 8.

The principles of the invention are also applicable to "mesa-less" processes and structures, as illustrated in FIGS. 8 and 9. The "mesa-less" process also begins with an N-type wafer having a P-type layer formed on the surface by diffusion&n or ion implantation. In the "mesa-less" process, the etch step to delineate individual P-type mesa regions is omitted. The oxide and metal layers are deposited on the P-type surface just prior to attachment to the transparent backing. Thinning and backside etching proceed as described supra in connection with FIGS. 6 and 7. The individual diodes are formed as the backside etch removes all the InSb (both N-type and P-type) between adjacent diodes. The edge of the P-N junction of each diode is thereby exposed on the side wall of the island forming each diode, as generally shown by the side view of this structure in FIG. 8, wherein N-type regions 63 are formed from an N-type bulk substrate having no mesas. P-type regions 62 are formed on the substrate as described supra with the exception that the "window" metal pattern is shown. Subsequent deposition of metal contact pads and growth of indium columns is the same for both styles of diode formation.

In the embodiment of the invention illustrated in FIGS. 8 and 9, metal grid 59, FIG. 3, is replaced with metal layer 81 having windows 82 therein. Windows 82 are positioned over the exposed faces of P-type regions 62 and have an area slightly less than the area of the P-type regions. Thereby, the P-type regions are connected together by metal layer 81. Because windows 82 and metal layer 81 have an area less than the areas of P-type regions 62, all of the P-type regions are connected together. The N-type regions of the diodes of detector array 52 are electrically isolated from metal layer 81 by oxide layer 61. Because the area of windows 82 can be controlled more accurately than the area of the P-type regions or the N-type regions, the uniformity of the response to optical energy is increased relative to the structure of FIG. 3. The window structure of FIGS. 8 and 9 can be used in a mesa structure of the type illustrated in FIG. 3.

While there have been described and illustrated several specific embodiments of the invention, it will be clear that variations in the details of the embodiment specifically illustrated and described may be made without departing from the true spirit and scope of the invention as defined in the appended claims. For example, in the illustrated embodiments there is only a small amount of shadow interference of the incident optical energy due to metal grid 59 or metal layer 61. In other embodiments, there can be considerably greater shadow interference (e.g., up to 99%).

We claim:

1. A method of making a semiconductor optical detector array comprising
    forming an array of P-N junctions on a bulk semiconductor substrate of a first conductivity type close to a surface of the bulk semiconductor, each of the junctions being between the first conductivity type bulk semiconductor and semiconductor regions of a second conductivity type,
    metallizing a portion of the semiconductor regions so the metallized portions of the semiconductor regions are electrically connected together,
    bonding the semiconductor regions of the second conductivity type to an optically transparent nonmetallic mechanical support backing so that an optical path subsists through the backing to at least a segment of the semiconductor regions of the second conductivity type, and
    reducing the thickness of the bulk substrate while the semiconductor regions are bonded to the backing
    so there is formed an array of semiconductor diode islands on the backing, each of the islands including a corresponding region of the bulk semiconductor, one of said junctions and one of the second conductivity type semiconductor regions.

2. The method of claim 1 further including attaching electrodes to the first conductivity type portion of the islands.

3. The method of claim 1 wherein the bulk semiconductor is N-type indium antimonide.

4. The method of claim 3 wherein semiconductor regions of the second conductivity type are formed by gaseous diffusion of dopant into the bulk semiconductor.

5. The method of claim 3 wherein semiconductor regions of the second conductivity type are formed by ion bombardment of dopant into the bulk semiconductor.

6. The method of claim 1 wherein semiconductor regions of the second conductivity type are formed by gaseous diffusion of dopant into the bulk semiconductor.

7. The method of claim 1 wherein semiconductor regions of the second conductivity type are formed by ion bombardment of dopant into the bulk semiconductor.

8. The method of claim 1 wherein the bulk substrate is N-type material and the semiconductor regions of the second conductivity type are of P-type material.

9. The method of claim 1 wherein the reducing step includes a first step wherein the bulk substrate is thinned and a second step wherein the thinned substrate is etched to form the islands.

10. The method of claim 9 wherein the bulk substrate is thinned during the first reducing step to a thickness of about 10 to 20 microns.

* * * * *